United States Patent
Uh et al.

(10) Patent No.: US 6,613,621 B2
(45) Date of Patent: Sep. 2, 2003

(54) METHODS OF FORMING SELF-ALIGNED CONTACT PADS USING A DAMASCENE GATE PROCESS

(75) Inventors: Hyung-Soo Uh, Seoul (KR); Kyu-Hynn Lee, Kyunggi-do (KR); Tae-Young Chung, Kyunggi-do (KR); Ki-Nam Kim, Kyunggi-do (KR); Yoo-Sang Hwang, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 127 days.

(21) Appl. No.: 09/803,244

(22) Filed: Mar. 9, 2001

(65) Prior Publication Data

US 2001/0055842 A1 Dec. 27, 2001

(30) Foreign Application Priority Data

Mar. 9, 2000 (KR) .......................... 2000-11821
Sep. 22, 2000 (KR) .......................... 2000-55794

(51) Int. Cl.[7] ............................. H01L 21/338
(52) U.S. Cl. .................. 438/183; 438/183; 438/176; 438/180; 438/181; 438/184; 438/185; 438/269; 438/275; 438/587
(58) Field of Search .................. 438/197, 300, 438/301, 633, 153, 154, 174, 176, 183, 184, 230, 269, 270, 271, 272, 180, 181, 185, 275, 587, FOR 193; 257/410

(56) References Cited

U.S. PATENT DOCUMENTS

| | | | | |
|---|---|---|---|---|
| 5,434,093 A | * | 7/1995 | Chau et al. ................. | 438/300 |
| 6,054,355 A | * | 4/2000 | Inumiya et al. ............ | 438/296 |
| 6,072,221 A | * | 6/2000 | Hieda ......................... | 257/382 |
| 6,225,173 B1 | * | 5/2001 | Yu .............................. | 438/301 |
| 6,258,711 B1 | * | 7/2001 | Laursen ...................... | 438/633 |
| 6,278,164 B1 | * | 8/2001 | Hieda et al. ................ | 257/410 |
| 6,333,247 B1 | * | 12/2001 | Chan et al. ................. | 438/586 |
| 6,346,438 B1 | * | 2/2002 | Yagishita et al. .......... | 438/197 |

* cited by examiner

Primary Examiner—George Fourson
Assistant Examiner—Julio J. Maldonado
(74) Attorney, Agent, or Firm—Myers Bigel Sibley & Sajovec

(57) ABSTRACT

Self-aligned contacts in integrated circuits can be formed on an integrated circuit substrate having an active region. A groove can be formed in the insulating layer and a conductive material can be formed in the groove to a level that is recessed in the groove. An insulating material can be formed in the groove on the conductive material that has an etch selectivity with respect to the insulating layer. A contact that is self-aligned to the active region can be then be formed.

18 Claims, 18 Drawing Sheets

METHODS OF FORMING SELF-ALIGNED CONTACT PADS USING A DAMASCENE GATE PROCESS

This application claims priority to Korean Patent Application No. 2000-11821, filed on Mar. 9, 2000, and to No. 2000-55794, filed on Sep. 22, 2000, the contents of which are hereby incorporated herein by reference in their entireties.

FIELD OF THE INVENTION

The present invention relates to semiconductor manufacturing, and more particularly to methods of forming self-aligned contacts.

BACKGROUND OF THE INVENTION

The semiconductor industry is continually striving to improve device performance while maintaining, or decreasing, the cost of the semiconductor product. These objects have been partially satisfied by the ability of the industry to create smaller semiconductor devices (or chips), thus enabling more semiconductor chips to be realized from a starting substrate, thus reducing the processing cost for a specific semiconductor chip. The ability to fabricate devices with sub-micron features has been the main contribution in obtaining smaller chips, with the smaller chips still maintaining levels of integration equal to integration levels achieved by larger chips.

The use of sub-micron features, or micro miniaturization, has resulted in smaller dimension of a gate electrode constituting a transistor. For example, feature sizes of about 0.1 microns may be realized. However, such micro-miniaturization may give rise to some problems in conventional gate electrode process. Particularly, micro-miniaturization may not ensure the reliability of the gate insulating layer.

A conventional gate electrode process is described as follows. A device isolation region is formed on a semiconductor substrate and impurities are implanted to form a channel region. A gate oxide layer and a gate electrode layer, such as polysilicon/tungsten layer, are sequentially formed and patterned into a gate electrode. Using the gate electrode as an implanting mask, impurities are implanted into the substrate to form low concentration drain regions, namely, LDD (lightly doped drain) regions.

The gate oxide may be subject to plasma damage during gate electrode patterning. In addition, the impurities implantation for the channel may degrade the reliability of the gate oxide. Furthermore, since channel impurities implantation is followed by LDD impurities implantation, impurities in the channel region may be re-distributed during an annealing process for curing point defects caused by the LDD impurities implantation.

In order to overcome some of the above-mentioned problems, a dummy gate process (or "damascene gate process") has been developed. FIGS. 1A, 1B and 2 are cross-sectional views of a semiconductor substrate to illustrate some problems associated with conventional dummy gate processes.

Referring to FIGS. 1A and 1B, a conventional dummy gate process is described. Referring now to FIG. 1A, a device isolation region 12 is formed in a predetermined portion of a semiconductor substrate 10. A dummy gate pattern (not shown) can be formed thereon. Using the dummy gate pattern as a mask, LDD impurities implantation can be carried out and annealed to form LDD region 16. A spacer 18 can be formed on a sidewall of the dummy gate pattern. A first insulating layer can be formed over an entire surface of the semiconductor substrate 10 and planarized down to a top surface of the dummy gate pattern to form a planarized first insulating layer 20. The dummy gate pattern can then be selectively removed to form a groove. Through the groove, impurities are implanted to form a channel region (not shown).

In turn, a gate electrode material can be deposited in the groove and on the first insulating layer 20, and then the gate electrode material can be planarized until the first insulating layer 20 is exposed, to form a gate electrode 24. Subsequently, a bit line and a storage node contact process can be carried out for electrical connection to the LDD region 16 outside of the gate electrode 24.

As is well known in the art, in order to provide process margin, a self-aligned contact process may be used during the bit line and storage node contact process. The self-aligned contact process selectively etches the oxide layer with respect to nitride layer covering the gate electrode, to form an opening exposing an LDD region. Accordingly, even in the presence of misalignment, the nitride layer protects the gate electrode, thereby blocking the gate electrode being exposed by the opening.

However, the conventional dummy gate process may suffer from problems during bit line and storage node contact formation processes. As shown in FIGS. 1A and 1B, the top of the gate electrode 24 may be exposed. Accordingly, the gate electrode 24 can be exposed when misalignment occurs during a photolithographic process used to form the contact. Namely, for a contact formation process, a second insulating layer 26 can be formed on the gate electrode 24 and on the first insulating layer 20. Through a photo-etching process, the second and first insulating layers 26 and 20 are selectively etched with respect to the nitride sidewall spacer 18, to form contact opening 28a and 28b. As can be seen, in the presence of the misalignment, the top of the gate electrode 24 can be exposed by the opening 28a and 28b, since the top of the gate is not protected. In addition, if the composition of the etchant is not optimal, the exposed gate electrode 24 may be etched. As a result, subsequently formed contact pads may come in contact with the gate electrode 24.

Accordingly, a protection nitride layer may be formed only on the gate electrode 24. However, it may be difficult to selectively form the protection nitride layer only on the gate electrode 24. As can be seen in FIG. 2, the protection nitride layer 25 can be formed on the first insulating layer 20 and the gate electrode 24. Accordingly, the protection nitride as well as the first and second insulating layers 20 and 26 is to be etched to form a contact opening, thereby making a self-aligned contact process difficult to achieve.

SUMMARY OF THE INVENTION

Embodiments according to the present invention can provide methods for forming self aligned contacts in integrated circuits. Pursuant to these embodiments, an insulating layer can be formed on an integrated circuit substrate having an active region. A groove can be formed in the insulating layer and a conductive material can be formed in the groove to a level that is recessed in the groove. An insulating material can be formed in the groove on the conductive material that has an etch selectivity with respect to the insulating layer. A contact that is self-aligned to the active region can be then be formed.

In some embodiments, the act of forming an insulating layer can be preceded by forming a dummy gate on the integrated circuit substrate including a spacer on a side wall of the dummy gate. In some embodiments, the act of forming the insulating later can be followed by removing the dummy gate and then forming a gate oxide layer in the groove.

In some embodiments, the act of removing can include dry etching the dummy gate and then wet etching the dummy gate. In some embodiments, the act of forming the conductive material in the groove can include the forming the conductive material in the groove recessed from an opening of the groove and on the insulating layer and removing the conductive material from the insulating layer and leaving conductive material in the groove.

In some embodiments, the act of removing the conductive material from the insulating layer and leaving conductive material in the groove can include forming an etching stopper layer on the conductive material in the groove and on the insulating layer and etching the etching stopper layer until the insulating layer is exposed.

In some embodiments the act of forming the conductive material in the groove can include forming the conductive material in the groove and on the insulating layer and etching the conductive material to recess the conductive material into the groove. In some embodiments, the act of etching the conductive material can include etching the conductive material to recess the conductive material about 2000 Angstroms from an opening of the groove. In some embodiments, an opening of the groove is wider than a base of the groove.

Further pursuant to embodiments of the present invention, a groove formed by removing a dummy gate pattern can be partially filled with a gate electrode material, and the remainder groove can be completely filled with a nitride layer to form a capping layer. Accordingly, a top portion of the damascene gate electrode can be covered with and protected by the capping layer.

Further according to the present invention, there are provided methods of forming a contact in a semiconductor substrate. The methods can include the acts of forming a dummy gate pattern on a semiconductor substrate, the dummy gate pattern having a sidewall spacer; forming a first insulating layer on an entire surface of the semiconductor substrate, the first insulating layer having a planar top surface and having the same level in height as the dummy gate pattern; selectively removing the dummy gate pattern with respect to the sidewall spacer and the first insulating layer to form a groove exposing a selected portion of the semiconductor substrate; forming a gate insulating layer on the exposed semiconductor substrate; partially filling the groove with a low resistant conductive material to form a gate electrode; and filling the remainder groove with an insulator having an etching selectivity with respect to the first insulating layer, to form a capping layer.

In some embodiments, the act of partially filling the groove with a low resistant conductive material to form a gate electrode comprises the acts of forming the low resistant conductive material in the groove and on the first insulating layer and selectively etching the low resistant conductive material with respect to the first insulating layer and the sidewall spacer as to be recessed to a selected depth from a top surface of the first insulating layer. Preferably, the low resistant conductive material is selected from a group consisting of titanium nitride/tungsten, polysilicon and polysilicon/silicide. Double layer of titanium nitride/tungsten is more preferable. In addition, a metal stable at high temperature can be used.

In other embodiments, the act of partially filling the groove with a low resistant conductive material to form a gate electrode comprises the act of forming the low resistant conductive material conformally in the groove and on the first insulating layer; forming an etching stopper on the conformal low resistant conductive material as to fill up the groove; etching the etching stopper and the conformal conductive material outside of the groove; and removing remainder etching stopper from the groove.

In other embodiments, the act of partially filling the groove with a low resistant conductive material to form a gate electrode comprises the acts of: forming the low resistant conductive material in the groove and on the first insulating layer to completely fill the groove; planarizing the conductive material until a top surface of the first insulating layer is exposed; and etching back the conductive material and recessing to a selected depth from a top surface of the insulating layer.

The act of forming a dummy gate pattern on a semiconductor substrate, the dummy gate pattern having a sidewall spacer, may comprise the acts of: forming a sacrificial insulating layer on the semiconductor substrate; forming a dummy gate material layer on the sacrificial insulating layer; patterning the dummy gate material layer to form the dummy gate pattern on the sacrificial insulating layer; forming a spacer layer on the sacrificial insulating layer and on the dummy gate pattern, the spacer layer having an etching selectivity with respect to the first insulating layer; and etching the spacer layer to form the sidewall spacer. Herein, the dummy gate pattern can be formed of a material that has an etching selectivity with respect to the spacer and the first insulating layer. For example, polysilicon and amorphous polysilicon can be used. In order to obtain an excellent dummy gate profile, polysilicon that is easily etched is more preferable. The sidewall spacer and the capping layer are formed of an insulator having an etching selectivity with respect to the first insulating layer. In addition, another spacer can be formed on inner sidewall of the groove to obtain sloped sidewall profile, resulting in relatively wider top portion as compared to bottom portion. Such sidewall profile of the groove can improve act coverage of the low resistant conductive material. Preferably, another sidewall spacer is formed of the same material as the sidewall spacer of the dummy gate pattern. Alternatively, the dummy gate pattern can be formed to have a sloped sidewall profile such that a top portion thereof is relatively wider than a bottom portion. Accordingly, the groove has a relatively wider top portion than the bottom.

The act of filling the remainder groove with an insulator having an etching selectivity with respect to the first insulating layer to form a capping layer can be followed by the acts of forming a second insulating layer on the first insulating layer and on the capping layer, the second insulating layer having an etching selectivity with respect to the sidewall spacer and the capping layer; patterning the second and first insulating layers to form an opening; removing exposed remainder sacrificial insulating layer to expose the substrate outside of the gate electrode; forming a conductive layer on the second insulating layer to fill the opening; and etching the conductive layer and the second insulating layer until the capping layer is exposed, to form a self-aligned contact pad. Preferably, the conductive layer is formed of the same material as the low resistant conductive material.

After forming the dummy gate pattern, LDD region can be further formed in the substrate outside of the dummy gate pattern by using the dummy gate pattern as a mask and first implanting impurities and annealing. At this time, the act of selectively removing the dummy gate pattern with respect to the sidewall spacer and the first insulating layer to form a groove exposing the semiconductor substrate comprise the acts of: selectively removing the dummy gate pattern with respect to the sidewall spacer, the first insulating layer and the sacrificial insulating layer; implanting second impurities into the exposed sacrificial insulating layer and annealing to form a self-aligned channel region in the substrate; and removing the exposed sacrificial insulating layer to expose the substrate.

The act of selectively removing the dummy gate pattern with respect to the sidewall spacer and the first insulating layer to form a groove exposing a selected portion of the semiconductor substrate can be followed by the acts of: removing the sidewall spacer and a part of the first insulating layer to enlarge the width of the groove, the enlarged groove having substantial vertical sidewall profile; and forming a reverse sidewall spacer on a sidewall of the enlarged groove, thereby narrowing a bottom of the resulting groove as compared to a top thereof. At this time, the sidewall spacer can be formed of the same material as the first insulating layer and the reverse sidewall spacer can be formed of a material that has an etching selectivity with respect to the first insulating layer.

Pursuant to other embodiments of the present invention, there are provided methods of forming a semiconductor device. The method can include the acts of forming a dummy gate pattern including a sacrificial insulating layer and a dummy gate material layer in this order on a semiconductor substrate; forming a sidewall spacer on sidewall of the dummy gate pattern; forming a first insulating layer on an entire surface of the semiconductor substrate, the first insulating layer having a planar top surface and having the same level in height as the dummy gate pattern; selectively removing the dummy gate pattern with respect to the sidewall spacer and the first insulating layer to form a groove exposing a selected portion of the semiconductor substrate; forming a gate oxide layer on the exposed semiconductor substrate; partially filling the groove with a low resistant conductive material to form a gate electrode; filling the remainder groove with an insulator having an etching selectivity with respect to the first insulating layer to form a capping layer; forming a second insulating layer on the first insulating layer and the capping layer, the second insulating layer having an etching selectivity with respect to the sidewall spacer and the capping layer; and selectively etching the second and first insulating layers with respect to the spacer and capping layer to form a self-aligned contact opening exposing the substrate outside of the gate electrode.

The act of partially filling the groove with a low resistant conductive material to form a gate electrode can include the acts of: forming the low resistant conductive material in the groove and on the first insulating layer to completely fill the groove; planarizing the conductive material until a top surface of the first insulating layer is exposed; and etching back the conductive material and recessing to a selected depth from a top surface of the insulating layer.

Pursuant to further embodiments according to the present invention, methods of forming semiconductor devices are provided. These embodiments can include forming a first dummy gate pattern and a second dummy gate pattern on a semiconductor substrate, wherein each dummy gate pattern has a sidewall spacer. The second dummy gate pattern can be wider than the first dummy gate pattern. A first insulating layer can be formed on an entire surface of the semiconductor substrate, wherein the first insulating layer has a planar top surface and has the same level in height as the dummy gate patterns. The first and second dummy gate patterns can be removed to form a first and a second grooves exposing selected portions of the substrate. First and a second gate oxide layers can be formed on the first and the second grooves respectively and a low resistance material layer can be formed on the first insulating layer thereby completely filling the first groove and partially filling the second groove due to width difference therebetween. An etching stopper can be formed on the conductive material to completely fill the remainder second groove. The etching stopper can be etched until the conductive material outside of the grooves is exposed. Using remainder etching stopper as an etch mask, the conductive material layer in the first groove can be etched to recess the conductive material from a top surface of the first insulating layer. An insulator can be formed to fill the first and second grooves to form a first capping layer and second capping layer.

The act of removing the first and second dummy gate patterns to form a first and a second grooves exposing a selected portion of the substrate can be followed by the acts of: removing the sidewall spacer and a portion of the first insulating layer on a top edge of the groove to enlarge the width of the grooves, the enlarged grooves having substantial vertical sidewall profile; and forming reverse sidewall spacers on a sidewall of the enlarged grooves, thereby narrowing a bottom of the resulting groove as compared to a top thereof. At this time, the sidewall spacer is formed of the same material as the first insulating layer and the reverse sidewall spacer is formed of a material that has an etching selectivity with respect to the first insulating layer.

In some embodiments according to the present invention, contacts can be formed by forming a second insulating layer on the first insulating layer and the capping layer, wherein the second insulating layer has an etching selectivity with respect to the sidewall spacer and the capping layer. The second and first insulating layers are selectively etched with respect to the spacer and capping layer to form a self-aligned contact opening exposing the substrate outside of the gate electrode. The first and second insulating layers can be silicon oxide and the capping layer and the sidewall spacer can be silicon nitride.

Preferably, each dummy gate pattern is formed of stacked layer including a sacrificial insulating layer and a dummy gate material layer. Herein, the act of forming a dummy gate pattern can be followed by a act of forming an LDD region in the substrate outside of the dummy gate pattern by using the dummy gate pattern as an implanting mask and implanting first impurities and annealing. In addition, the act of removing the dummy gate pattern to form a groove exposing the substrate comprises the acts of: selectively removing the dummy gate pattern with respect to the sidewall spacer, the first insulating layer and the sacrificial insulating layer; implanting second impurities into the exposed sacrificial insulating layer and annealing to form a self-aligned channel region in the substrate; and removing the exposed sacrificial insulating layer to expose the substrate.

DETAILED DESCRIPTION OF EMBODIMENTS ACCORDING TO THE PRESENT INVENTION

Figure 1A:
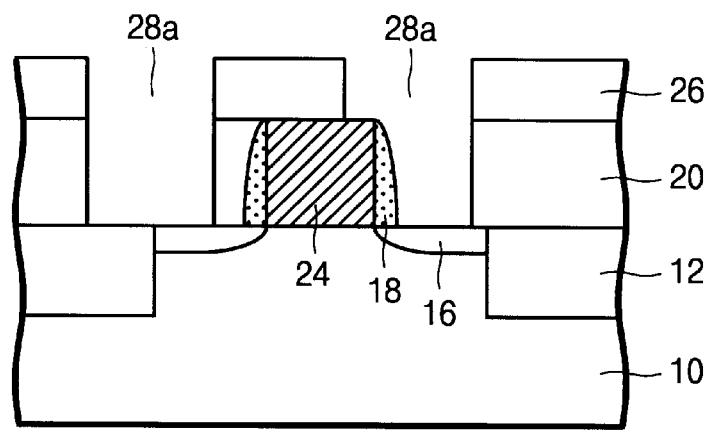
FIGS. 1 and 2 are cross-sectional views of an integrated circuit substrate to illustrate problems according to a conventional dummy gate process.
Figure 1B:
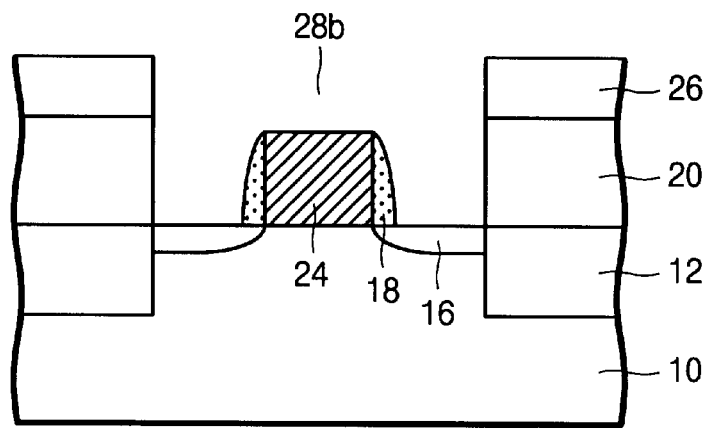
Figure 2:
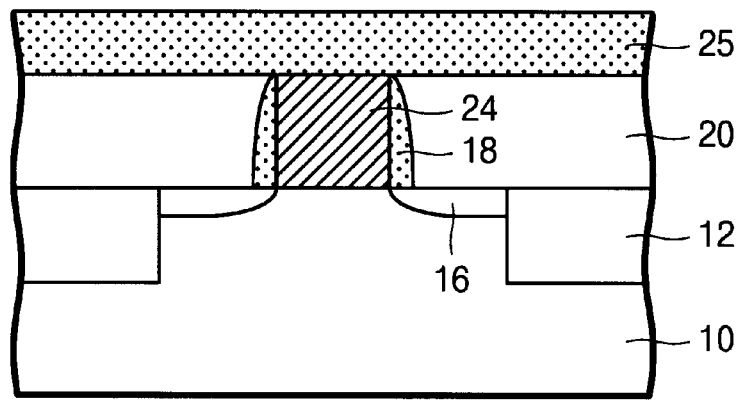

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

One standard photolithographic process includes creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the materials left unprotected by the photoresist and then stripping the remaining photoresist. Another well-known process that is used extensively in this and many other integrated circuit fabrication processes is chemical mechanical polishing (CMP). These and other standard processes are well known and need not be described further herein.

Typically, the conductivity of a semiconductor substrate is opposite to that of an LDD region and source/drain region therein. For example, if the substrate is p-type, n-type impurities may be implanted into the substrate, and vice versa. In the present invention, p-type substrate is described. However, it will be appreciated that an n-type substrate can be used with the present invention.

FIGS. 3 to 12 are cross-sectional views of a semiconductor substrate schematically illustrating forming damascene gate electrodes and self-aligned contacts according to the present invention. Though a plurality of gate patterns are formed on the semiconductor substrates at the same time, only one of them is shown in the FIGS. 3 to 12 for clarity.

Figure 3A:
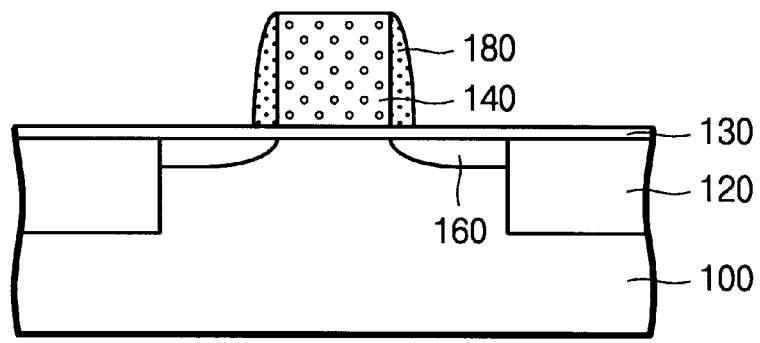
FIGS. 3 to 14 are cross-sectional views of integrated circuit substrates at selected stages of forming damascene gate electrodes and contacts according to the present invention.

Referring now to FIG. 3A, provided is a p-type semiconductor substrate 100 having a dummy gate pattern 140 and a sidewall spacer 180. More particularly, a device isolation region 120 can be formed at a predetermined portion of the semiconductor substrate 100 to define an active region. The device isolation region 120 can be formed by a well-known technique such as shallow trench isolation or local oxidation of silicon. A sacrificial insulating layer 130 can be formed on the resulting stricture having the device isolation region 120. The sacrificial insulating layer 130 can be formed of an oxide layer. The sacrificial insulating layer 130 can be formed by a low-pressure chemical vapor deposition (LPCVD) technique or by plasma enhanced chemical vapor deposition (PECVD). Other techniques may be used. Preferably, the sacrificial insulating layer 130 can be formed by a thermal process to a thickness of about 100 to 300 angstroms.

A dummy gate material layer can be formed on the sacrificial insulating layer 130 and patterned to form a dummy gate pattern 140. After forming the dummy gate pattern 140, impurities implantation for lightly doped drain (LDD) can be carried out by using the dummy gate pattern 140 as an implanting mask. Preferably, phosphorous is implanted to a dose of about $1 \times 10^{13}$ atoms/cm$^2$ at an energy of about 20 to 30 keV. After that, an annealing process can be carried out to activate the implanted impurities and to cure substrate defects, thereby forming an LDD region 160. An insulating spacer 180 is formed on sidewalls of the dummy gate pattern 140.

Figure 3B:
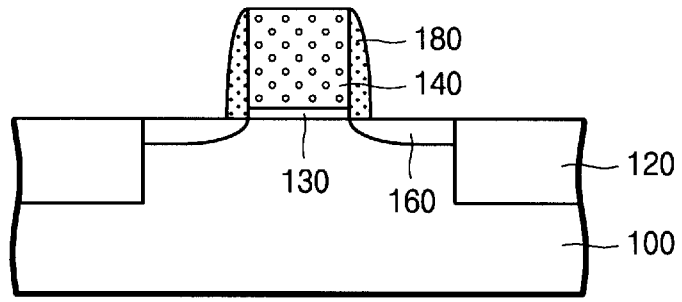

More particularly, the dummy gate material can be formed of a material that has an excellent etching selectivity with respect to the dummy gate spacer 180 and subsequently formed first and second insulating layers (refer to 200 of FIG. 4 and 260 of FIG. 9). It is preferable that the material can provide a desired dummy gate pattern profile. For example, in case that the dummy gate spacer is formed of a silicon nitride, and the first and second insulating layers are formed of an oxide, the dummy gate material layer may be formed of polysilicon, amorphous silicon, or the like, preferably, polysilicon formed to a thickness of about 4000 to 5000 angstroms by LPCVD. The patterning of the dummy gate pattern is carried out under an etching condition having a high selectivity with respect to the underlying sacrificial insulating layer 130. The dummy gate pattern is formed to have a wider top relative to the bottom. As a result, a subsequently formed groove (refer to 220 of FIG. 5) can be wider at the opening than at the bottom, which can provide a good topology for gate material layer deposition. After forming the dummy gate pattern 140, sacrificial insulating layer 130 outside of the dummy gate pattern 140 can be removed depending on the fabrication process, as shown in FIG. 3B.

The dummy gate spacer 180 can be formed of a silicon nitride layer. More particularly, a silicon nitride layer can be formed on the dummy gate pattern 140 and the sacrificial insulating layer 130 conformally. Preferably, the silicon nitride layer is formed by PECVD, LPCVD, or the like to a thickness of about 500 to 600 angstroms. The deposited silicon nitride layer can be then anisotropically etched to form the dummy gate spacer 180 on sidewalls of the dummy gate pattern 140.

Figure 4:
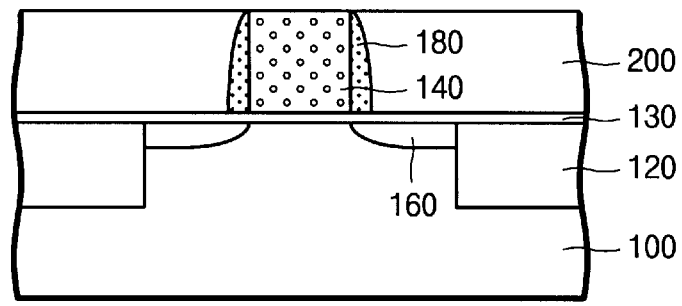

Referring now to FIG. 4, a first insulating layer can be formed on the dummy gate pattern 140 and the dummy gate spacer 180. The first insulating layer can be formed of a doped or undoped silicon oxide layer. Particularly, the first insulating layer can be formed to a thickness of about 4000 to 5000 angstroms by PECVD, atmospheric pressure CVD (APCVD), or the like. In succession, a planarization process can be carried out until the dummy gate pattern 140 is exposed to form a planarized first insulating layer 200. For example, chemical mechanical polishing (CMP) or etch back can be used.

Figure 5:
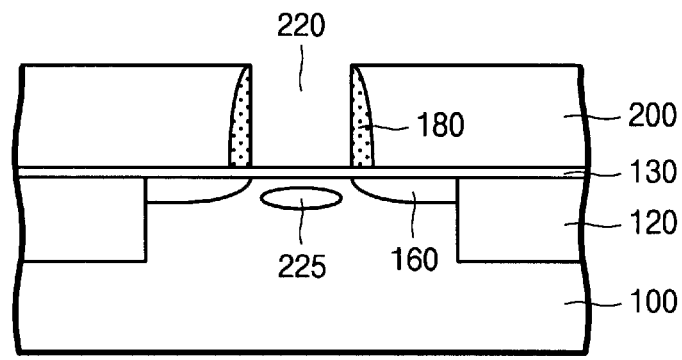

Next, referring to FIG. 5, the dummy gate pattern 140 can be removed to form a groove 220 corresponding thereto. The removal of the dummy gate pattern 140 can be carried out under an etching condition having a high selectivity with respect to the first insulating layer 200 and the dummy gate spacer 180. Dry etching or wet etching can be used. For example, dry etching can be carried out under low power and high pressure conditions in order to enhance isotropic etching characteristics. $SF_6$, $O_2$ or the like can be used as source gas. Wet etching can use, for example, a mixture of $HNO_3$, HF, $CH_3COOH$, and $H_2O$. A combination of dry etching and wet etching also can be used, preferably sequentially performing dry etching and then wet etching.

The groove 220 can be filled with a conductive material. In order to improve act coverage of the conductive material, an insulating spacer (not shown) can be formed on sidewall of the groove, extending toward the interior of the groove 220 at the bottom. Thus, the top of the groove becomes relatively wide as compared to the bottom.

Next, a channel region 225 can be formed by implanting impurities into the substrate 100 through sacrificial insulating layer 130 exposed by the groove 220, and then annealing. Accordingly, the channel region 225 can be formed in a self-aligned manner in the substrate 100 under the dummy gate pattern 140, i.e., between the already-formed LDD region 160, potentially reducing junction leakage and junction capacitance as compared to conventional channel implantation techniques that are performed on the whole substrate. Preferably, B (boron) or $BF_2$ is implanted to a dose of about $1 \times 10^{13}$ atoms/cm$^2$ at an energy of about 20 to 30 keV. Exposed sacrificial insulating layer 130 over the channel region 225 can be removed by using buffered hydrofluoric acid, exposing the substrate 100.

Figure 6A:
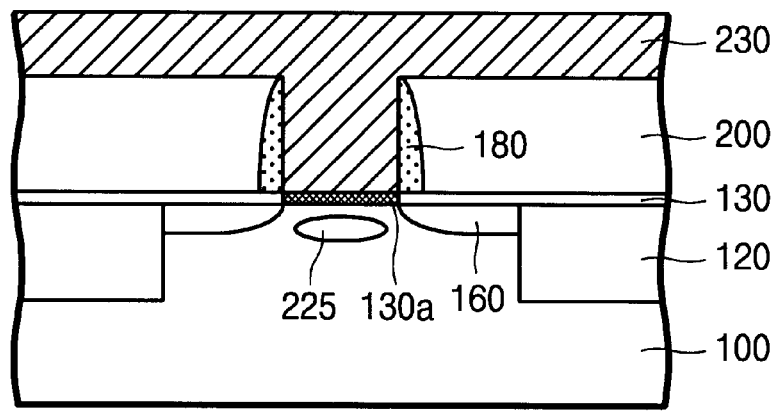

Next, referring to FIG. 6A, a gate oxide layer 130a can be formed on the exposed substrate 100 in the groove 220. As the gate oxide layer 130a is formed after the process for dummy gate pattern and impurities implanting and annealing, a more reliable gate oxide may be obtained. The gate oxide layer 130a can be formed of, for example, silicon oxynitride, tantalum oxide ($Ta_2O_5$) or silicon dioxide. Since a silicon oxynitride layer and a tantalum oxide have a high dielectric constant compared to silicon dioxide, they can be formed relatively thick, thereby avoiding use of thin gate oxide processes that require careful process control. For example, the gate oxide layer 130a can be formed to a thickness of about 40 to 50 angstroms by a thermal oxide process, a tantalum oxide layer can be formed to a thickness of about 100 to 150 angstroms and a silicon oxynitride layer can be formed to a thickness of about 60 angstroms to 70 angstroms.

After forming the gate oxide layer 130a, a conductive material 230 can be formed in the groove 220 and on the first insulating layer 200. Preferably, the conductive material 230 is formed of a metal that inflicts minimum damage on the oxide layer 130a during its deposition, has excellent adhesion, and has an excellent act coverage characteristic to fill the groove without void. Titanium nitride/tungsten is used. Titanium nitride can be formed by an atomic layer deposition (ALD) technique, or a CVD technique to a thickness of about 200 angstroms. Tungsten can be formed by a CVD technique to a thickness of about 2000 angstroms. A silicide layer or a metal that is stable at high temperatures can be used. Polysilicon, polysilicon/tungsten silicide also can be used.

Figure 7:
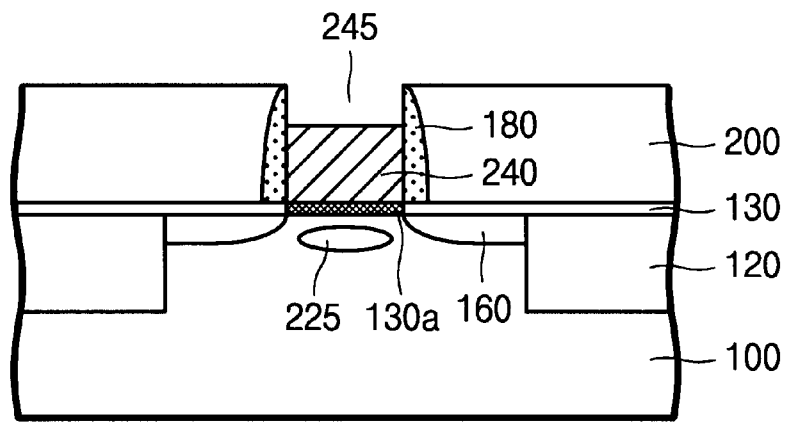

Next, as shown in FIG. 7, by using an etch back technique, the conductive material 230 in the first insulating layer 200 outside of the groove 220 is removed to recess (refer to 245) the conductive material 230 into the groove 220 to a predetermined depth (or recess dimension) from a surface level of the first insulating layer 200, thereby forming a low resistance gate electrode 240. Herein, the recess dimension can depend on gate sheet resistance and the thickness of a gate capping layer for self-aligned contact etching. Preferably, the recess dimension is about 2000 angstroms.

Figure 6B:
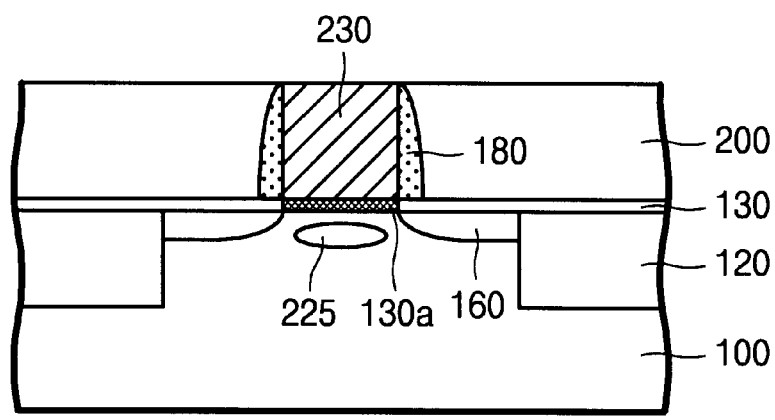

Alternatively, the recessed gate electrode 240 can be formed as follows. First, a planarization process can be carried out as shown in FIG. 6B until a top surface of the first insulating layer 200 is exposed, and then an etch back can be carried out to form the recessed gate electrode 240.

Figure 8:
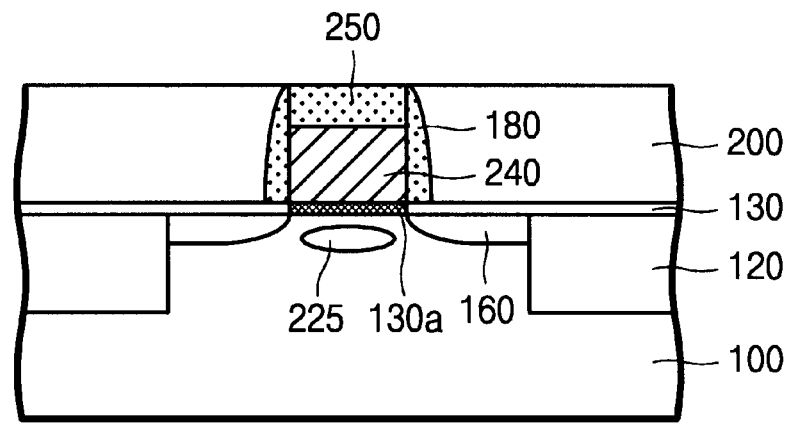

Referring now to FIG. 8, gate capping layer 250 can be formed on the first insulating layer 200 to fill the recess region 245. The gate capping layer 250 protects the gate electrode 240, and can be formed of a material that has an etching selectivity with respect to subsequently-formed second insulating layer (refer to 260 of FIG. 9). Preferably, the gate capping layer 250 is formed of the same material as the dummy gate spacer 180. As a result, the gate electrode 240 can be completely covered with a protection layer, for example, the dummy gate spacer 180 for sidewall protection and the capping layer 250 for top surface protection.

Figure 9:
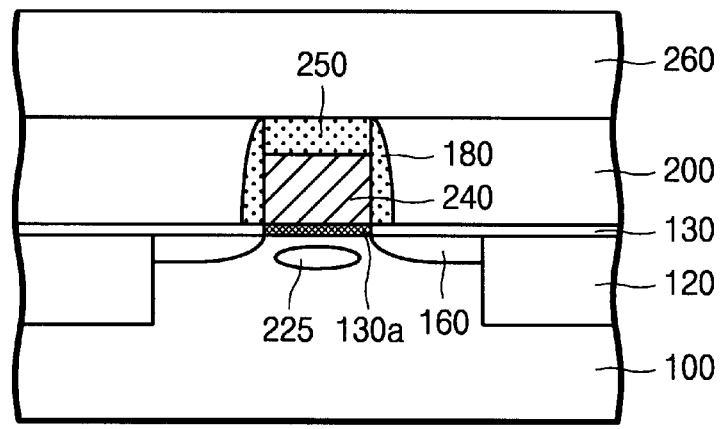
Figure 10:
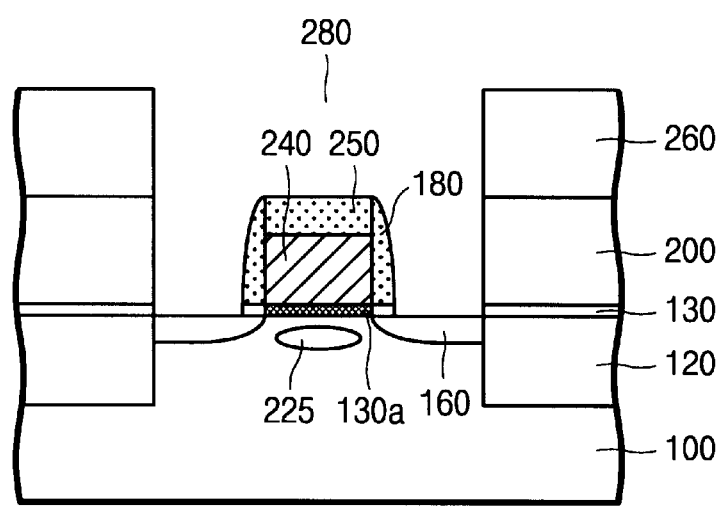

The next process sequence is the formation of self-aligned contact, schematically shown in FIGS. 9 to 12. Referring now to FIG. 9, a second insulating layer 260 can be formed on the first insulating layer 200 and on the gate capping layer 250. The second insulating layer 260 can be formed of a material that has an etching selectivity with respect to the gate capping layer 250 and the dummy gate spacer 180. Preferably, the second insulating layer 260 is formed of a silicon oxide to a thickness of about 1500 to 2000 angstroms by PECVD. Through photolithography and an etching process, the second insulating layer 260, the first insulating layer 200 and the sacrificial insulating layer 130 can be selectively patterned with respect to the spacer 180 and the capping layer 250, thereby forming a self-aligned contact opening 280 exposing the LDD region 160 between the gate electrode, as shown in FIG. 10.

Figure 11:
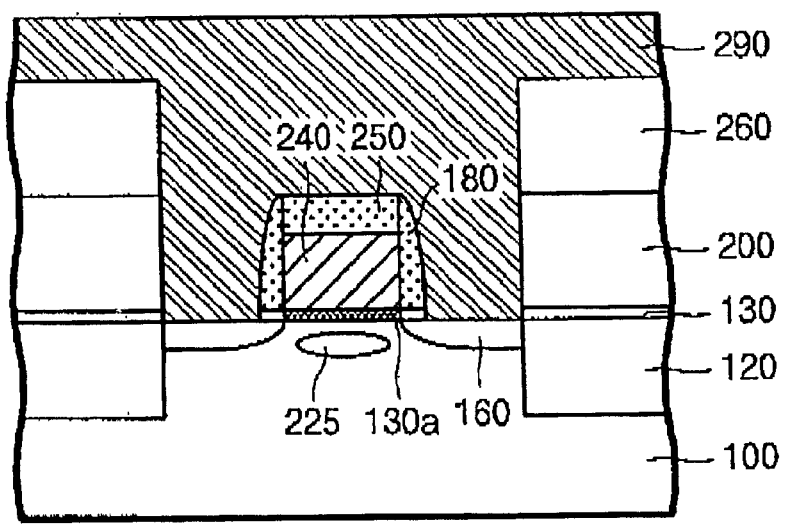
Figure 12:
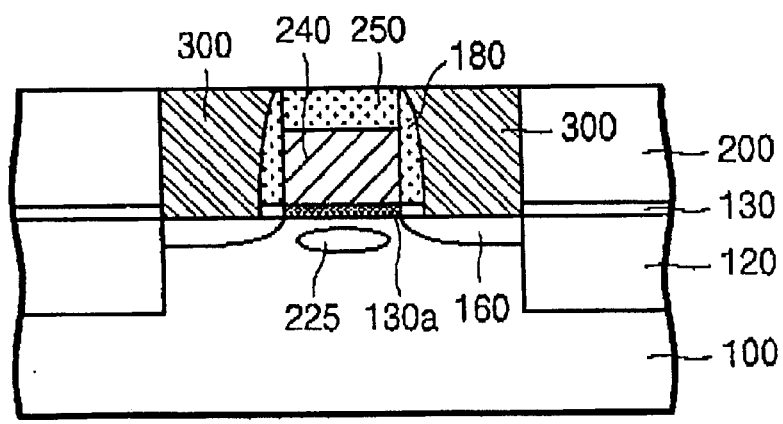

A conductive layer 290 can be formed on the second insulating layer 260 to fill the opening 280 as shown in FIG. 11. Preferably, the conductive layer 290 is formed of the same material as the gate electrode 240. Next, a planarization process such as CMP or etch back can be carried out until a top surface of the gate capping layer 250 is exposed, to form contact pads 300 electrically isolated from another, as shown in FIG. 12.

Subsequently, a conventional processes of bit line formation, capacitor formation, metal wiring, and passivation can be carried out.

Figure 13:
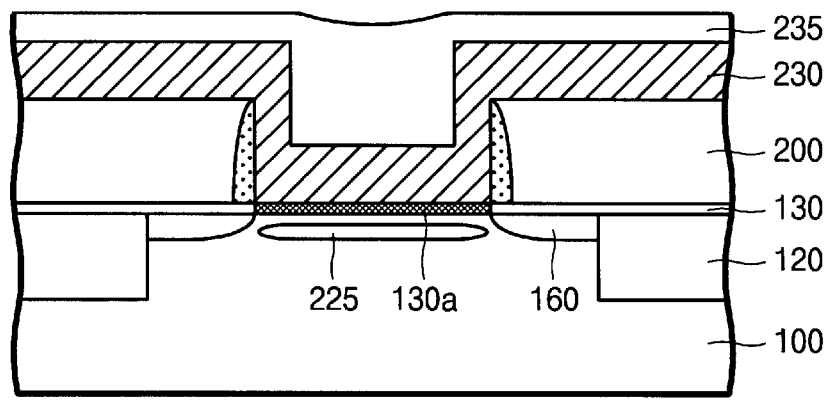
Figure 14:
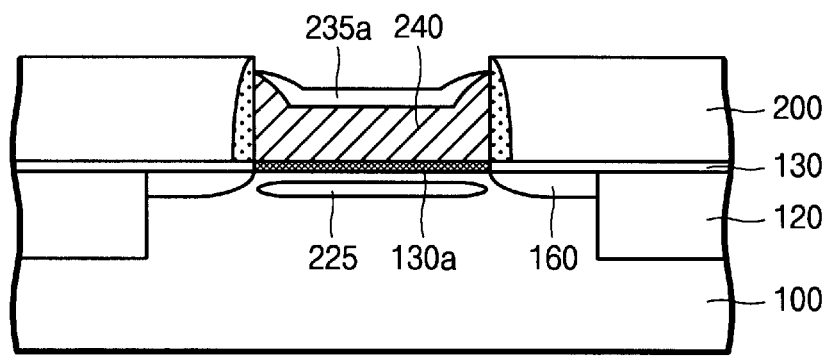

If the dummy gate pattern is wide, the recessed gate electrode can be formed as shown in FIGS. 13 to 14. After forming the groove 220 as shown in FIG. 5, a conductive material is deposited on the first insulating layer 200. However, since the width of the groove is wide, the deposited conductive material 230 may fill only a portion of the groove 220. Namely, the conductive material 230 may be formed on the first insulating layer 200 and in the groove 220 conformally. Accordingly, only the conductive material 230 outside of the groove is preferably etched. For this end, an etching stopper 235 for protecting the conductive material layer 230 inside the groove 220 is formed on the conformal conductive material layer 230 as shown in FIG. 13. The etching stopper 235 can be formed of a re-flowable layer, such as photoresist layer or spin-on-glass layer. The etching stopper layer 235 can be flowable at low temperature suitable for planarization. The etching stopper 235 can be formed relatively thin outside of the groove 220 and relatively thick in the groove 220, substantially filling the groove 220.

Next, an etch back process is carried out until a surface of the first insulating layer 200 is exposed. During this etch back process, the etching stopper 235 and the conductive material 230 outside of the groove 220 are removed. However, in the groove 200, due to the thicker etching stopper 235, a part 235a of the etching stopper 235 remains (refer to 235a) while the first insulating layer outside of the groove is exposed, thereby protecting underlying conductive material 240, as shown in FIG. 14. The remainder etching stopper 235a can be removed to form a recessed gate electrode.

FIGS. 24 to 28 are cross-sectional views of a semiconductor substrate at selected stages of a method of forming a damascene gate and self-aligned contact according to another embodiment of the present invention. In the drawings, only one gate pattern is illustrated for simplicity.

In FIGS. 24 to 28, the same parts as shown in FIGS. 3 to 12 are identified with the same reference numbers. In contrast to FIGS. 3 to 12, the dummy gate spacer is removed and a reverse spacer extending toward the interior groove is formed. In addition, the dummy gate spacer may be a different material compared to FIGS. 3 to 12. Dummy gate sidewall spacer 180a can be formed of a material not having etching selectivity with respect to the first insulating layer 200. Preferably, the dummy gate spacer 180a of the present embodiment is formed of the same material as the first insulating layer 200, i.e., a silicon oxide layer.

Figure 24:
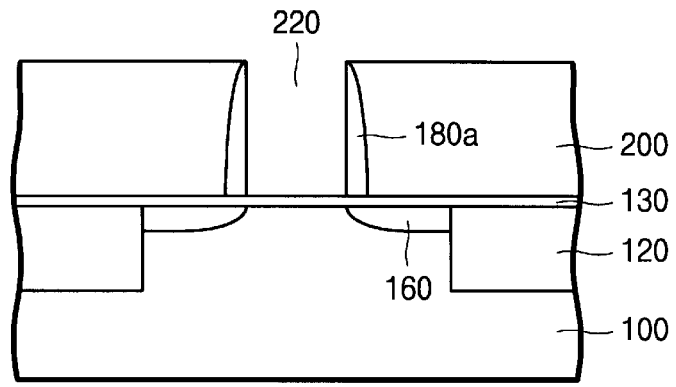
Figure 25:
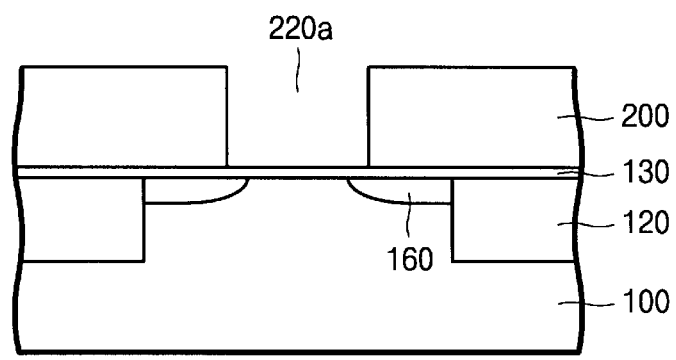

Referring to FIG. 24, a groove 200 is formed by removing the dummy gate pattern as described in reference to FIG. 5. Next, the dummy gate spacer 180a is removed. Herein, a part of the first insulating layer 200, near a top edge of the groove 220 also may be etched, thereby enlarging the groove width dimension. The sidewall profile of the enlarged groove 220a can be substantially vertical, as shown in FIG. 25.

Figure 26:
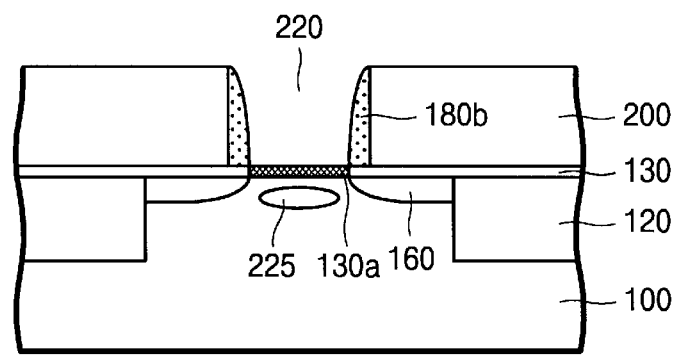

Referring to FIG. 26, on the sidewall of the enlarged groove 220a, a reverse spacer 180b extending toward interior of enlarged groove 220a is formed. The reverse spacer 180b can be formed of a material that has an etching selectivity with respect to the first insulating layer 200. For example, the reverse spacer 180b can be formed from a silicon nitride layer. Due to the reverse spacer 180b, the top of the groove 220 becomes wider than the bottom, which can provide a good topology for subsequent conductive material deposition. In succession, impurities are implanted into the substrate 100 through the sacrificial oxide layer 130, and then annealed to form a channel region 225. The exposed sacrificial oxide layer 130 can be removed and a gate oxide layer 130a can be formed.

Figure 27:
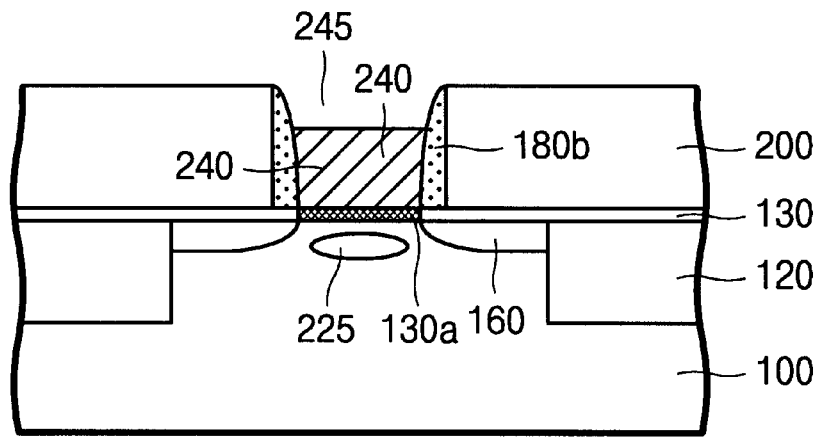

Next, conductive material can be formed on the first insulating layer 200 to fill the groove 220. CMP planarization process can be carried out on the conductive material until a top surface of the interlayer insulating layer 200 is exposed. Subsequently, etch back process can be carried out to recess the conductive material in the groove 220 to form recessed gate electrode 240, as shown in FIG. 27. Alternatively, the recessed gate electrode 240 can be formed by an etch back process without CMP planarization, as described in reference to FIGS. 3 to 12.

Figure 28:
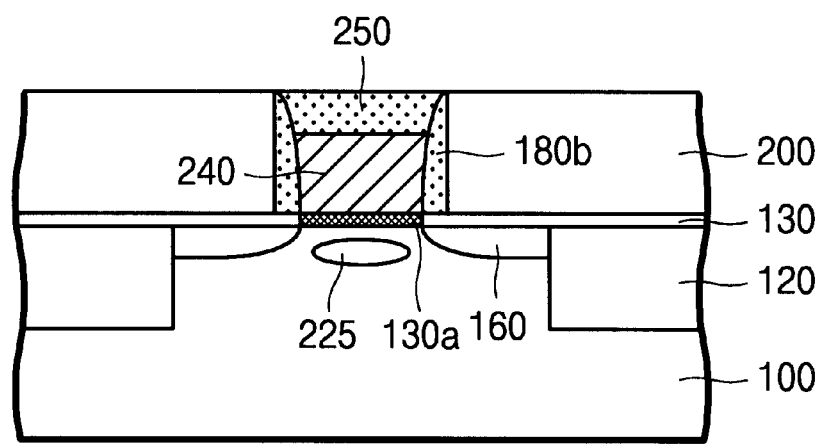

Referring now to FIG. 28, a gate capping layer 250 can be formed on the first insulating layer 200 to fill the recess 245. As shown in the drawing, the gate electrode can be completely protected by the capping layer 250 and reverse spacer 180b. In addition, the outer profile of the protection layer can exhibit a rectangular configuration, thereby enhancing protection at the top edge of the gate electrode. Accordingly, safe margin for a subsequent self-aligned contact process can be increased. Subsequently, a self-aligned contact process can be carried out, as described in reference to FIGS. 9 to 12.

Hereinbefore, for simplicity only one gate electrode (which can be a gate electrode of cell region or core/peripheral region) has been illustrated in the figures. Hereinafter, embodiments according to the present invention will be described, considering a cell array region and a core/peripheral region as shown in FIGS. 15 to 23. The dimension of the gate electrodes of the cell array region can be narrower than that of the core/peripheral region.

Figure 15:
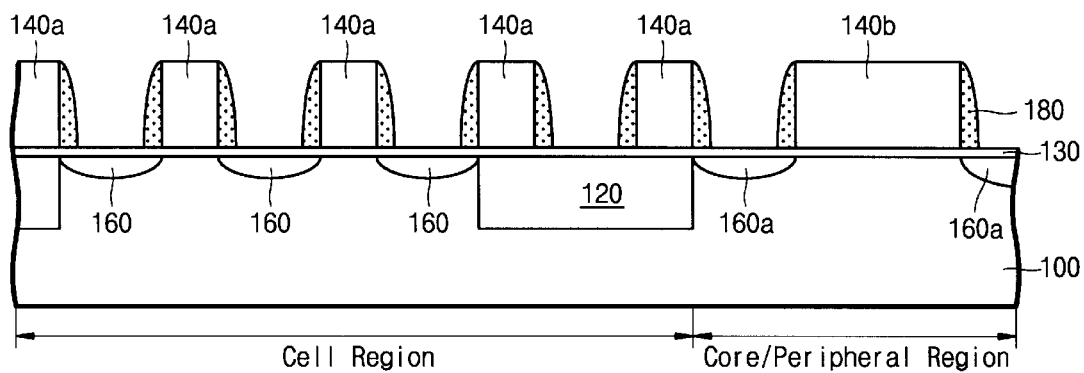
FIGS. 15 to 28 are cross-sectional views of a integrated circuit substrate at selected stages of forming damascene gate electrodes and contacts according to the present invention.

In FIGS. 15 to 23, the same parts shown in FIGS. 3 to 14 are identified with the same reference numbers. Referring now to FIG. 15, a device isolation region 120 can be formed on a semiconductor substrate 100 to define an active region of a cell array region and a core/peripheral region. A sacrificial oxide layer 130, dummy gate patterns 140a and 140b, dummy gate sidewall spacers 180 and LDD regions 160, 160a can be formed as described previously. The dummy gate pattern 140b of the core/peripheral region can be wider than the dummy gate pattern 140a of the cell array region. After forming the dummy gate spacer 180, impurities can be implanted into the core/peripheral region to form a source/drain region using the dummy gate pattern 140b and spacer 180. In case of an NMOS transistor, phosphorous can be implanted as a dose of about $1\times10^{14}$ atoms/cm$^2$ to $5\times10^{14}$ atoms/cm$^2$ at an energy of about 20 to 30 keV and annealing process can be carried out to form a source/drain region 160a.

Figure 16:
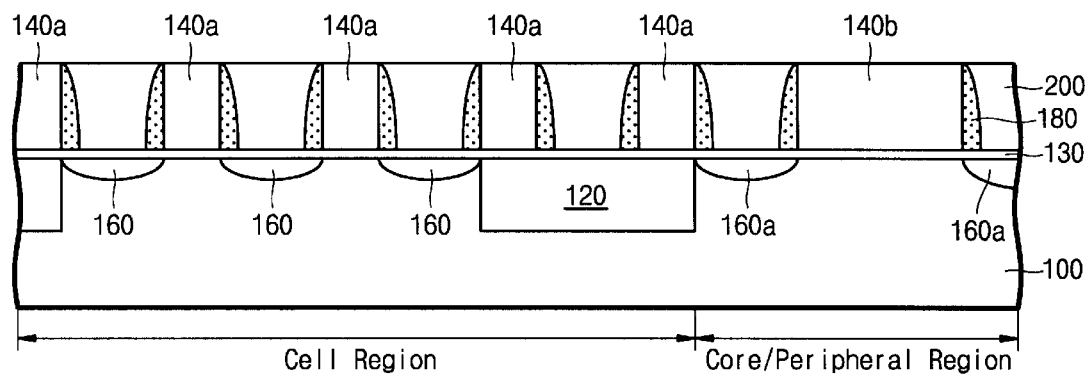
Figure 17:
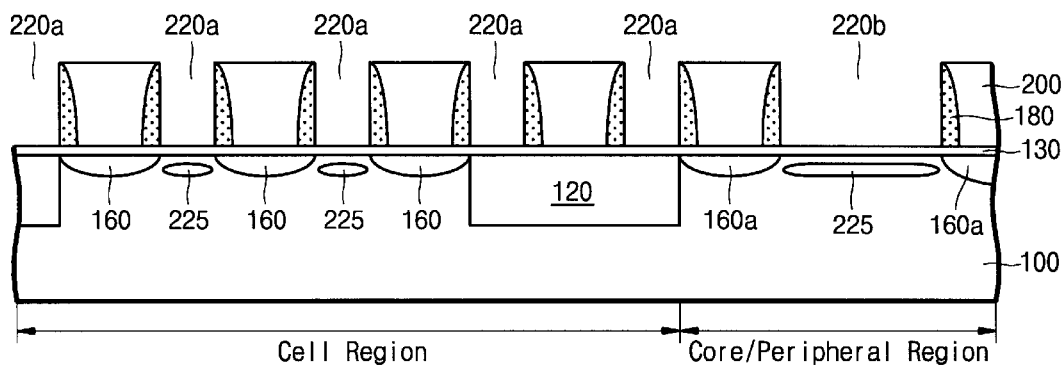
Figure 18:
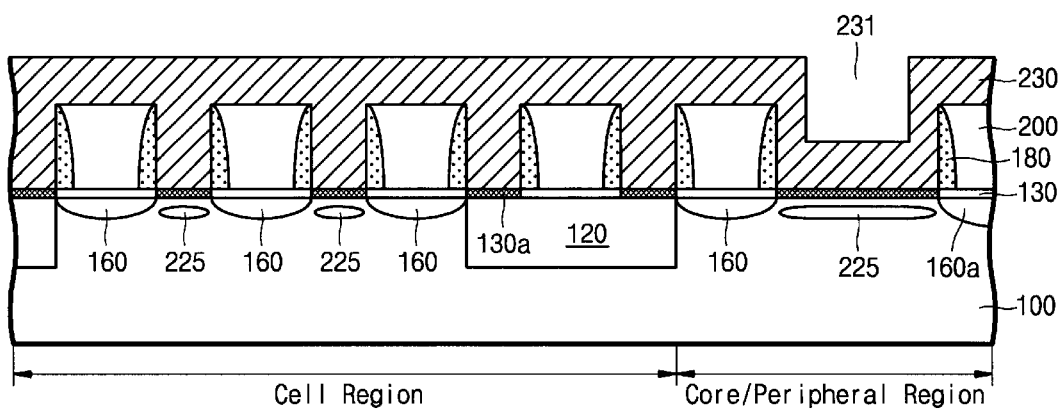

Referring now to FIG. 16, a planar first insulating layer 200 can be formed on the resultant structure. Grooves 220a and 220b can be formed by removing the dummy gate patterns 140a and 140b of the cell array region and the core/peripheral region, as shown in FIG. 17. Channel implantation and an annealing process can be are carried out to form channel regions 225. Exposed sacrificial oxide layer 130 in the grooves 220a and 220b can be removed and gate oxide layers 130a can be formed over the channel regions 225. Next, a conductive material 230 can be formed on the first insulating layer 200 as shown in FIG. 18. The groove 220a of the cell array region can be completely filled with the conductive material 230, but the groove 220b of the core/peripheral region may be partially filled due to a difference in width therebetween. As a result, a recess 231 may be formed in the groove 220b of the core/peripheral region.

Figure 19:
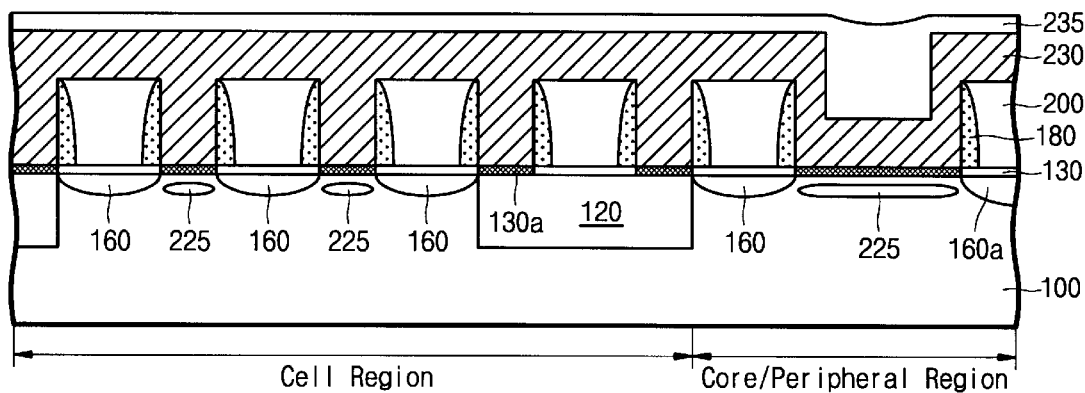

Next, as shown in FIG. 19, an etching stopper 235 can be formed on the conductive material. The etching stopper 235 can be formed of a reflowable layer such as photoresist layer and spin-on-glass layer. The etching stopper 235 can be formed relatively thin in the cell array region and relative thick in the groove 220b of the core/peripheral region, filling the recess 231.

Figure 20:
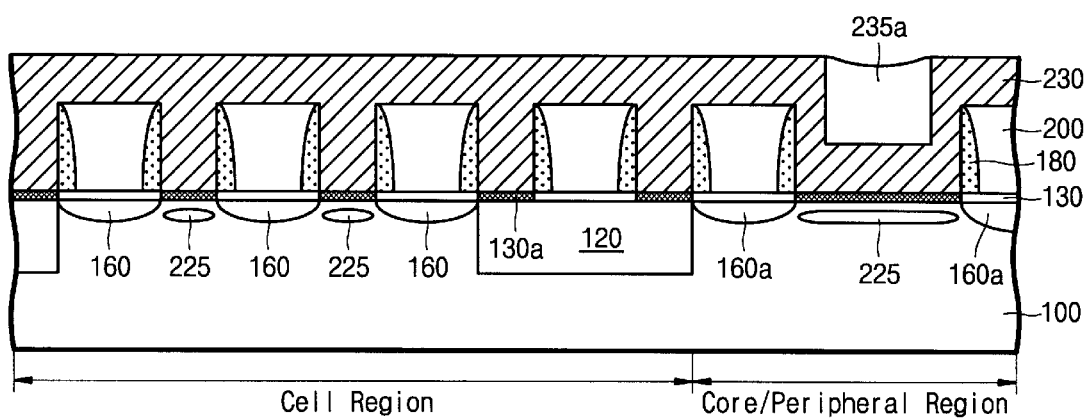
Figure 21:
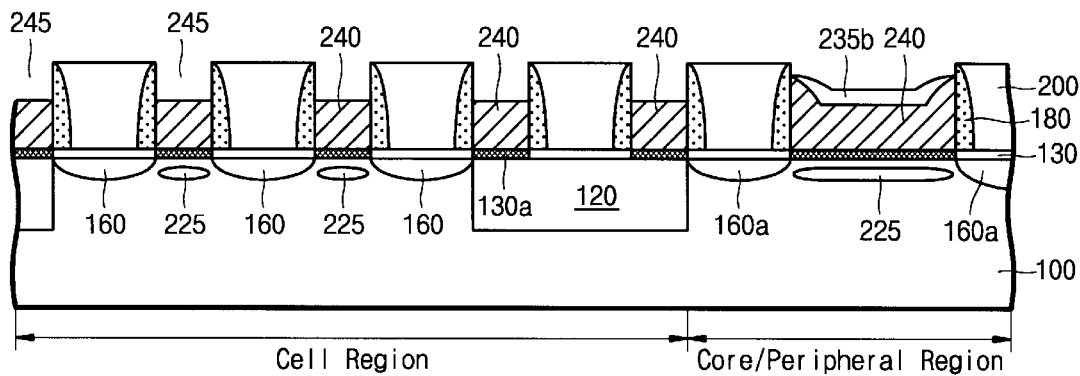

Next, an etching process for forming a recessed gate of the cell array region can be carried out. As shown in FIG. 20, the etching stopper 235 outside of the groove 220b of the core/peripheral region can be etched until a surface of the conductive material 230 is exposed. A thick etching stopper 235a may remain on the conductive material in the grove 220b to cover and protect the conductive material in the core/peripheral region. In succession, an etching process can be carried out to remove the exposed conductive material outside of the groove 220a while etching a portion thereof in the groove to form a recessed gate electrode 240 and to expose the first insulating layer 200 in the cell array region as shown in FIG. 21. The conductive material in the groove 220b of the core/peripheral region may be protected by the thick etching stopper 235a. The etching process may etch only a portion of the thick etching stopper 235a in the groove 220b, and thus a remainder etching stopper 235b may cover the conductive material in the groove 220b in the core/peripheral region. The remainder etching stopper 235b may or may not be removed.

Figure 22:
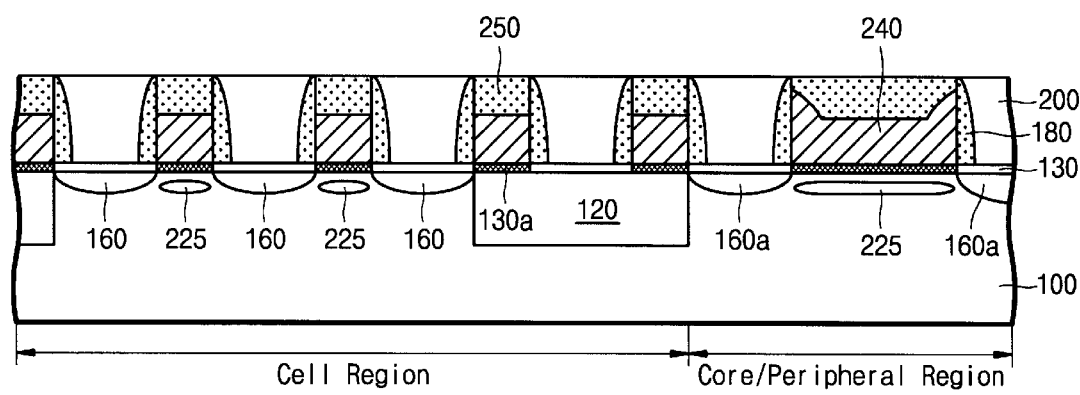
Figure 23:
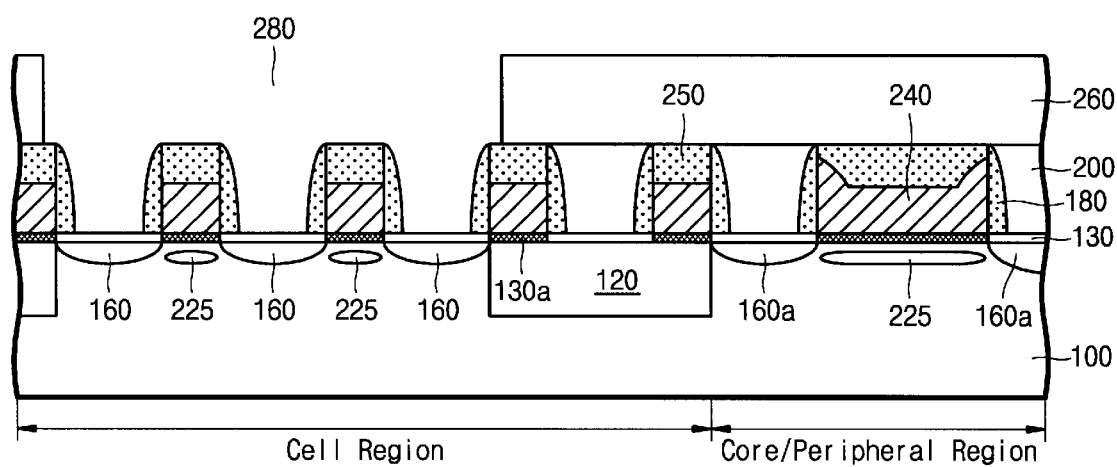

Referring now to FIG. 22, gate capping layers 250 can be formed on the recessed gate electrodes 240. A second insulating layers 260 can be formed on the gate capping layer 250 and the first insulating layer 200. A self-aligned contact opening 280 can be formed as shown in FIG. 23.

Subsequently, a conductive layer can be formed and planarized to form contact pads, as shown in FIG. 12.

FIGS. 29 to 33 are cross-sectional views of a semiconductor substrate at selected stages of a method of forming a damascene gate and self-aligned contact according to embodiments of the present invention. In FIGS. 29 to 33, the same parts as shown in FIGS. 3 to 28 are identified with same reference numbers.

Figure 29:
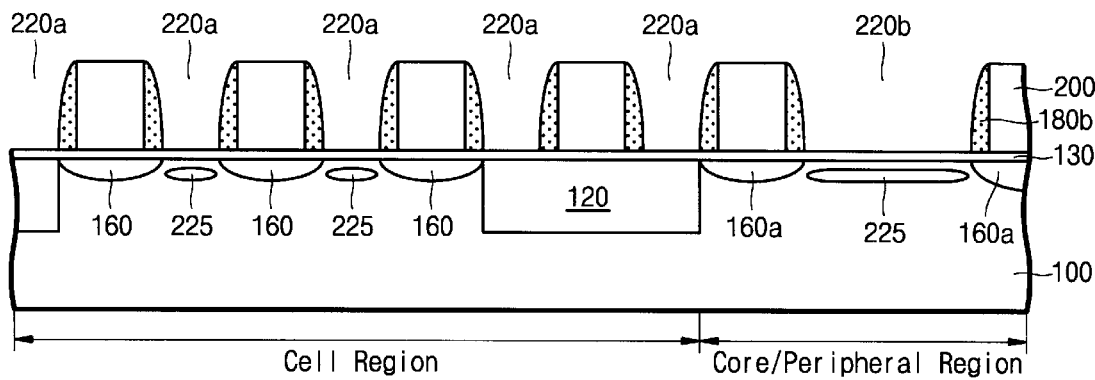
FIGS. 29 to 33 are cross-sectional views of a integrated circuit substrate at selected stages of forming damascene gate electrodes and contacts according to the present invention.
Figure 30:
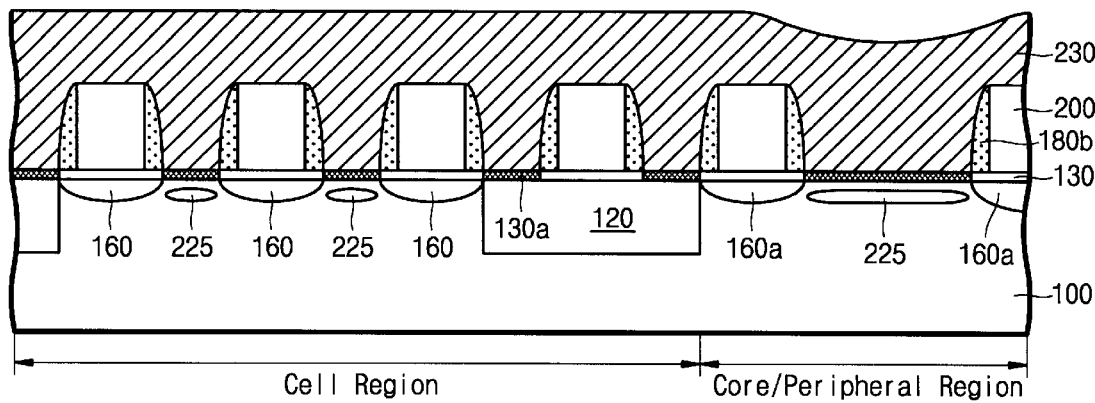

As described with reference to FIGS. 24 to 26, grooves 220a and 220b, and reverse spacer 180b can be formed as shown in FIG. 29. Impurities can be implanted into the substrate 100 exposed by the grooves and an annealing process can be carried out to form channel regions 225. After removing a sacrificial oxide layer, gate oxide layer 130a can be formed, as shown in FIG. 30. In contrast to FIGS. 15 to 23, both the grooves 220a and 220b can be filled with conductive material 230.

Figure 31:
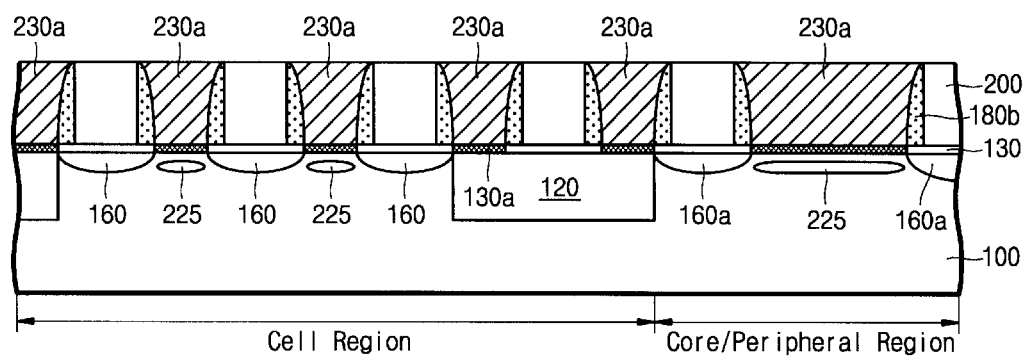
Figure 32:
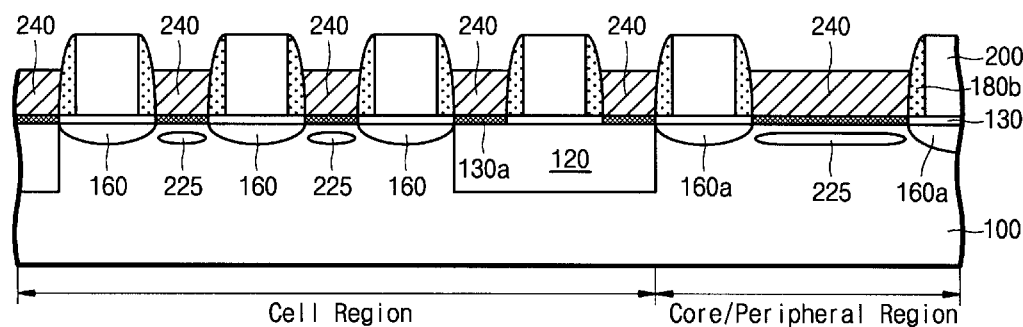
Figure 33:
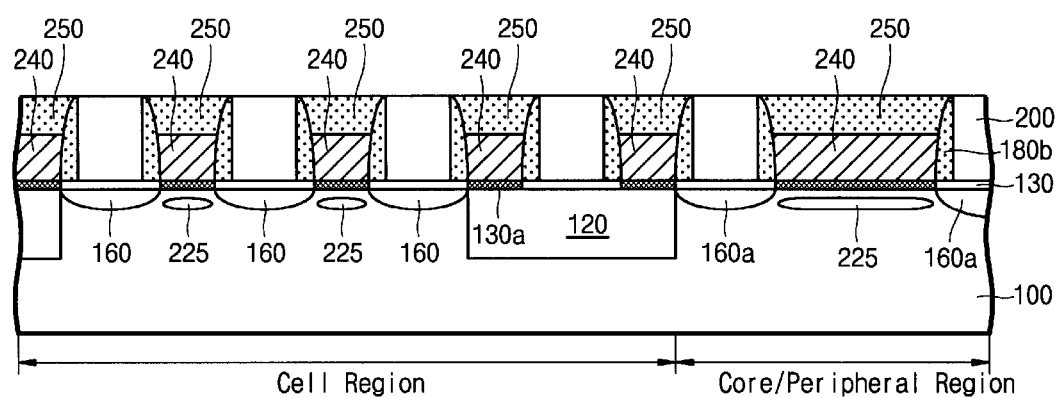

As shown in FIG. 31, the conductive material 230 can be planarized until a surface of the first insulating layer 200 is exposed. An etch back process can be conducted on the planarized conductive material 230a to form recessed gate electrodes 240 as shown in FIG. 32 both in the cell and in the core/peripheral regions. Next, recesses can be filled with a capping layer 250 to protect a top portion of the gate electrode 240, as shown in FIG. 33. Accordingly, each gate electrode 240 of the cell region and the core/peripheral region can be completely covered with a protection layer, for example, reverse spacer 180b and capping layer 250. The protection layer can exhibit a rectangular configuration due to the shape of the reverse spacer 180b. As a result, increased margin against misalignment at a top edge portion of the gate electrode 240 can be provided. Subsequently, a self-aligned contact process can be carried out. As described above, according to the present invention, a low resistance gate electrode can be realized concurrently realizing self-aligned contact process.

Namely, with damascene gate processes according to embodiments of the present invention, plasma damage caused by gate patterning can be removed. Metal gates can be formed, which can improve high-speed operation.

Because the gate electrode is formed after forming the LDD region, gate erosion can be reduced. In addition, since the channel region is formed in a self-aligned manner after forming the LDD region, junction capacitance and junction leakage can be reduced, and dopant re-distribution of the channel region also can be reduced.

In damascene gate processes according to embodiments of the present invention, self-aligned contact processes for bit line and storage node formation can be realized. In addition, using a reverse spacer, the thickness of top edge portion of the gate can be increased, thereby improving process margin for formation of self-aligned contacts.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a semiconductor device with a reduced gate resistance and a self-aligned contact pad, the method comprising:

forming a first dummy gate pattern and a second dummy gate pattern on a semiconductor substrate, each dummy gate pattern having a sidewall spacer, the second dummy gate pattern relatively being wider than the first dummy gate pattern;

forming a first insulating layer on an entire surface of the semiconductor substrate, the first insulating layer having a planar top surface and having the same level in height as the dummy gate patterns;

removing the first and second dummy gate patterns to form a first and a second grooves exposing the substrate;

forming a first and a second gate oxide layers on the first and the second grooves respectively;

forming a low resistance material layer on the first insulating layer thereby completely filling the first groove and partially filling the second groove due to width difference therebetween;

forming an etching stopper on the conductive material to completely fill the remainder second groove;

etching the etching stopper until the conductive material outside of the grooves is exposed;

using remainder etching stopper as an etch mask and etching the conductive material layer in the first groove to recess from a top surface of the first insulating layer; and forming an insulator to fill remainder first and second grooves to form a first capping layer and a second capping layer.

2. The method according to claim 1, wherein the act of removing the first and second dummy gate patterns to form a first and a second grooves exposing the substrate is followed by the acts of:

removing the sidewall spacer and a portion of the first insulating layer on a top edge of the groove to enlarge the width of the grooves, the enlarged grooves having substantial vertical sidewall profile; and forming reverse sidewall spacers on a sidewall of the enlarged grooves, thereby narrowing a bottom of the resulting groove as compared to a top thereof.

3. The method according to claim 2, wherein the sidewall spacer is formed of the same material as the first insulating layer and the reverse sidewall spacer is formed of a material that has an etching selectivity with respect to the first insulating layer.

4. The method according to claim 1, wherein the etching stopper is formed of photoresist layer or spin-on-glass layer.

5. The method according to claim 1, wherein the capping layer and the sidewall spacer are formed of silicon nitride respectively and the first and the second insulating layer are formed of silicon oxide respectively.

6. The method according to claim 5, further comprising the acts of:

forming a second insulating layer on the first insulating layer and the capping layer, the second insulating layer having an etching selectivity with respect to the sidewall spacer and the capping layer; and selectively etching the second and first insulating layers with respect to the spacer and capping layer to form a self-aligned contact opening exposing the substrate outside of the gate electrode.

7. The method according to claim 1, further comprising removing the remainder etching stopper layer from the second groove.

8. A method of forming an integrated circuit device, the method comprising:

forming a first and second spaced apart dummy gates on a substrate, the first and second dummy gates having respective first and second side wall spacers thereon, the second dummy gate being wider than the first dummy gate;

removing the first and second dummy gates to form first and a second grooves; and forming a gate electrode in the first groove to a first level and in the second groove to a second level that is less than the first level due to the second groove being wider than the first groove.

9. A method according to claim 8 wherein the act of removing comprises:

dry etching the first and second dummy gates; and then wet etching the first and second dummy gates.

10. A method of forming an integrated circuit device, the method comprising:

forming first and second spaced apart dummy gates on a substrate, the first and second dummy gates having respective first and second side wall spacers thereon, the second dummy gate being wider than the first dummy gate;

removing the first and second dummy gates to form first and second grooves in the substrate; and forming a conductive material in the first groove to a first level and in the second groove to a second level that is less than the first level.

11. A method according to claim 10 wherein the step of forming the conductive material comprises:

forming an insulating layer on the substrate and in the first and second grooves;

forming the conductive material in the first and second grooves recessed from an opening of the first and second grooves;

removing an amount of the conductive material to leave conductive material in the first and second grooves.

12. A method according to claim 11 wherein the step of forming the conductive material comprises:

etching the conductive material to recess the conductive material into the first and second grooves.

13. A method according to claim 11 wherein the insulating layer comprises a first insulating layer, the method further comprising:

forming a second insulating layer on the first insulating layer;

etching a contact hole through the first and second insulating layers to expose an active region of the substrate; and forming a contact in the contact hole self-aligned to the active region.

14. A method according to claim 11 wherein an opening of the first groove is wider than a base of the first groove.

15. A method according to claim 11 wherein the conductive material is selected from a group consisting of TiN/W, polysilicon and polysilicon/silicide.

16. A method according to claim 11 wherein the insulating layer is selected from a group consisting of silicon oxide, silicon oxynitride, and tantalum oxide, the sidewall spacer and the capping layer are formed of silicon nitride layer, respectively.

17. A method according to claim 11 wherein the step of forming a conductive material in the groove comprises:

forming the conductive material in the first and second grooves on the insulating layer to completely fill the first and second grooves;

planarizing the conductive material until a top surface of the insulating layer is exposed; and selectively etching back the conductive material into the first groove to a selected depth from a top surface of the insulating layer.

18. A method according to claim 10 wherein the step of forming a conductive material in the first and second grooves comprises:

forming the conductive material conformally in the first and second grooves;

forming an etching stopper on the conformal conductive material;

etching the etching stopper and the conductive material outside of the first and second grooves; and removing a remaining portion of the etching stopper from the first and second grooves.

* * * * *